United States Patent
Doi et al.

(10) Patent No.: US 8,278,198 B2
(45) Date of Patent: Oct. 2, 2012

(54) SEMICONDUCTOR DEVICE AND METHOD OF PRODUCING THE SAME

(75) Inventors: Yuuki Doi, Miyazaki (JP); Hirokazu Fujimaki, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 83 days.

(21) Appl. No.: 12/860,409

(22) Filed: Aug. 20, 2010

(65) Prior Publication Data
US 2011/0042775 A1    Feb. 24, 2011

(30) Foreign Application Priority Data
Aug. 21, 2009   (JP) .................................. 2009-191545

(51) Int. Cl.
*H01L 21/425*  (2006.01)
(52) U.S. Cl. ........ 438/534; 438/570; 438/581; 257/475; 257/476

(58) Field of Classification Search .................. 438/534, 438/570, 581; 257/475, E21.334, E29.338
See application file for complete search history.

(56) References Cited

U.S. PATENT DOCUMENTS
7,750,426 B2 *   7/2010   Girdhar et al. ................ 257/476

FOREIGN PATENT DOCUMENTS
JP        2003-229570        8/2003

* cited by examiner

*Primary Examiner* — Theresa T Doan
(74) *Attorney, Agent, or Firm* — Kubotera & Associates, LLC

(57) ABSTRACT

A method of producing a Schottky diode includes the steps of: forming a resist layer on the semiconductor substrate; performing a first exposure process on the resist layer; performing a first developing process for developing the resist layer to form a first Schottky diode having an excess region; performing a first cleaning process; performing a second exposure process on the first Schottky diode; performing a second developing process on the first Schottky diode to remove the excess region from the first Schottky diode so that a second Schottky diode corresponding to the specific Schottky diode is formed; and performing a second cleaning process.

4 Claims, 5 Drawing Sheets

Plan view

SEMICONDUCTOR DEVICE AND METHOD OF PRODUCING THE SAME

BACKGROUND OF THE INVENTION AND RELATED ART STATEMENT

The present invention relates to a method of producing a semiconductor device and a method of producing the semiconductor device. More specifically, the present invention relates to a Schottky diode and a method of producing the Schottky diode.

In a Schottky diode, a metal is connected to a semiconductor to create a Schottky barrier, so that the Schottky barrier is utilized in the Schottky diode. In the Schottky diode, a large number of carriers operate. Accordingly, as opposed to a normal PN connection diode, a voltage decrease in a forward direction is relatively small, thereby achieving a high switching speed. For this characteristic, the Schottky diode has been widely used for a standard logic IC to increase an operational speed thereof, a power source of an audio apparatus, or a switching power source.

Patent Reference has disclosed a conventional Schottky diode.

Patent Reference: Japanese Patent Publication No. 2003-229570

FIG. 1 is a schematic sectional view showing a configuration of the conventional Schottky diode disclosed in patent Reference. As shown in FIG. 1, the conventional Schottky diode includes an N-type epitaxial layer 10; an N+ embedded diffusion layer 12; an N− diffusion layer 14; a P− diffusion layer 16; a P+ diffusion layer 18; and a metal layer 20.

In the conventional Schottky diode shown in FIG. 1, an anode is formed of the metal layer 20 disposed on an N-type substrate, thereby constituting a Schottky barrier diode. A peripheral area of the anode is surrounded with the P− diffusion layer 16. A cathode is drawn through the embedded diffusion layer 12 and the N− diffusion layer 14 for separating elements, thereby reducing a parasitic resistivity.

In the conventional Schottky diode shown in FIG. 1, the P− diffusion layer 16 is provided for alleviating an electrical filed concentration at an end portion of the conventional Schottky diode. Accordingly, a reverse voltage resistance of the conventional Schottky diode is determined by a distance between the P− diffusion layer 16 and the embedded diffusion layer 12.

In other words, the reverse voltage resistance of the conventional Schottky diode is determined by a thickness of the N-type epitaxial layer 10. Accordingly, when it is necessary to obtain a desirable reverse voltage resistance (or obtain a reverse voltage resistance greater than that determined by a normal thickness of the N-type epitaxial layer 10), it is necessary to increase the thickness of the N-type epitaxial layer 10.

In the conventional Schottky diode shown in FIG. 1, the thickness of the N-type epitaxial layer 10 has a significant influence on a property of other component, thereby making it difficult to increase the thickness of the N-type epitaxial layer 10. Further, when the thickness of the N− type epitaxial layer 10 increases, the parasitic resistivity tends to increase due to the configuration of the cathode drawn through the embedded diffusion layer 12 and the N− diffusion layer 14, thereby decreasing a current capability in a forward direction.

In view of the problems described above, an object of the present invention is to provide a Schottky diode and a method of producing a Schottky diode capable of solving the problems of the conventional method of producing the Schottky diode. In the present invention, it is possible to produce the Schottky diode capable of arbitrarily obtaining a desirable reverse voltage resistance.

Further objects and advantages of the invention will be apparent from the following description of the invention.

SUMMARY OF THE INVENTION

In order to attain the objects described above, according to a first aspect of the present invention, a method of producing a Schottky diode includes the steps of: preparing a semiconductor substrate; forming a first conductive type embedded oxide film and a first conductive type epitaxial layer on the semiconductor substrate; forming a first conductive type diffusion layer in the first conductive type epitaxial layer so that the first conductive type diffusion layer is connected to the first conductive type embedded oxide film; forming an insulation film on the first conductive type epitaxial layer; forming a second conductive type diffusion layer through ion implantation with the insulation film as a mask so that an electrical field concentration at an end portion of the Schottky diode is alleviated; forming a silicide layer (a metal layer) at an upper portion of the second conductive type diffusion layer; forming a contact in the insulation film so that the contact is connected to the first conductive type diffusion layer; and forming a wiring portion layer on the insulation film so that the wiring portion layer is connected to the contact.

According to a second aspect of the present invention, a Schottky diode includes: a semiconductor substrate; a first conductive type embedded oxide film formed on the semiconductor substrate; a first conductive type epitaxial layer formed on the semiconductor substrate; a first conductive type diffusion layer formed in the first conductive type epitaxial layer and connected to the first conductive type embedded oxide film; a field oxide film formed on the first conductive type epitaxial layer; a second conductive type diffusion layer formed through ion implantation with the field oxide film as a mask so that an electrical field concentration at an end portion of the Schottky diode is alleviated; a silicide layer (a metal layer) formed at an upper portion of the second conductive type diffusion layer; a contact formed in the field oxide film and connected to the first conductive type diffusion layer; and a wiring portion layer formed on the field oxide film and connected to the contact.

In the second aspect of the present invention, the second conductive type diffusion layer is away from the first conductive type embedded oxide film by a distance in a depth direction greater than a distance between the second conductive type diffusion layer and the first conductive type diffusion layer in a horizontal direction.

In the present invention, a breakdown location (a reverse voltage resistance) of the Schottky diode is determined by a thickness between an anode and a cathode. Accordingly, it is possible to arbitrarily obtain a desirable reverse voltage resistance. As a result, it is possible to reduce a size of the Schottky diode.

More specifically, the reverse voltage resistance of the Schottky diode is determined by a distance between the first conductive type diffusion layer and the second conductive type diffusion layer. Accordingly, it is possible to arbitrarily obtain the desirable reverse voltage resistance. In other words, it is possible to arbitrarily adjust the reverse voltage resistance without changing a thickness of the first conductive type epitaxial layer. Further, it is possible to reduce a length of a current path and a parasitic resistivity, thereby improving a current capability in a forward direction.

DETAILED DESCRIPTION OF PREFERRED EMBODIMENTS

Hereunder, preferred embodiments of the present invention will be explained with reference to the accompanying drawings.

First Embodiment

Figure 1:
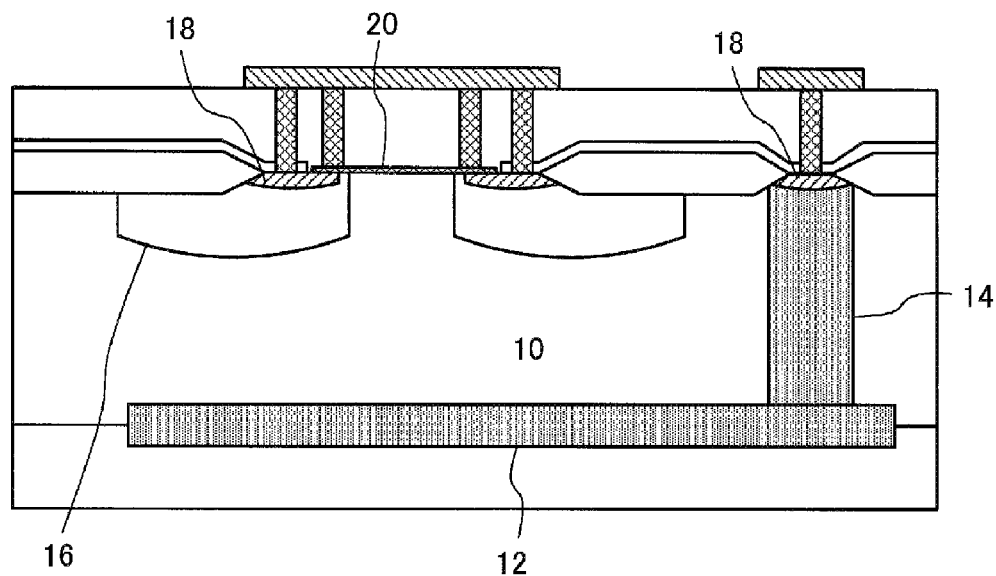
FIG. 1 is a schematic sectional views showing a conventional Schottky diode.
Figure 2A:
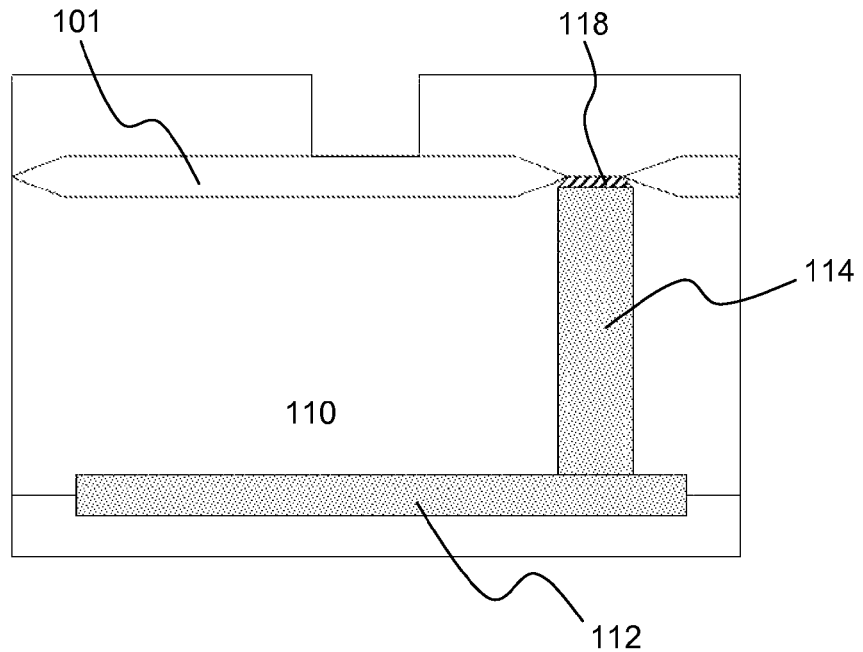
FIGS. 2(A) and 2(B) are schematic sectional views No. 1 showing a method of producing a Schottky diode according to a first embodiment of the present invention.
Figure 2B:
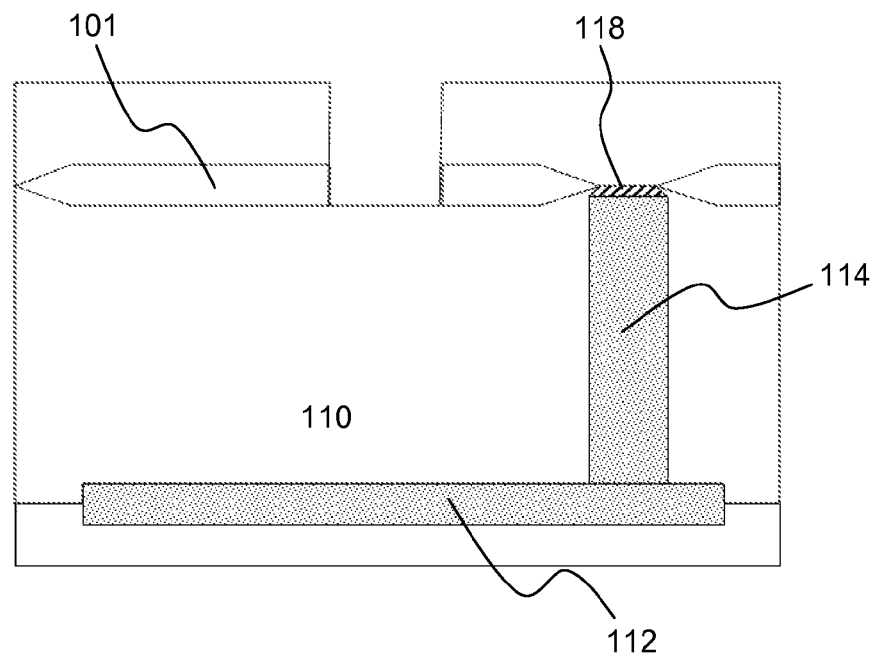
Figure 3A:
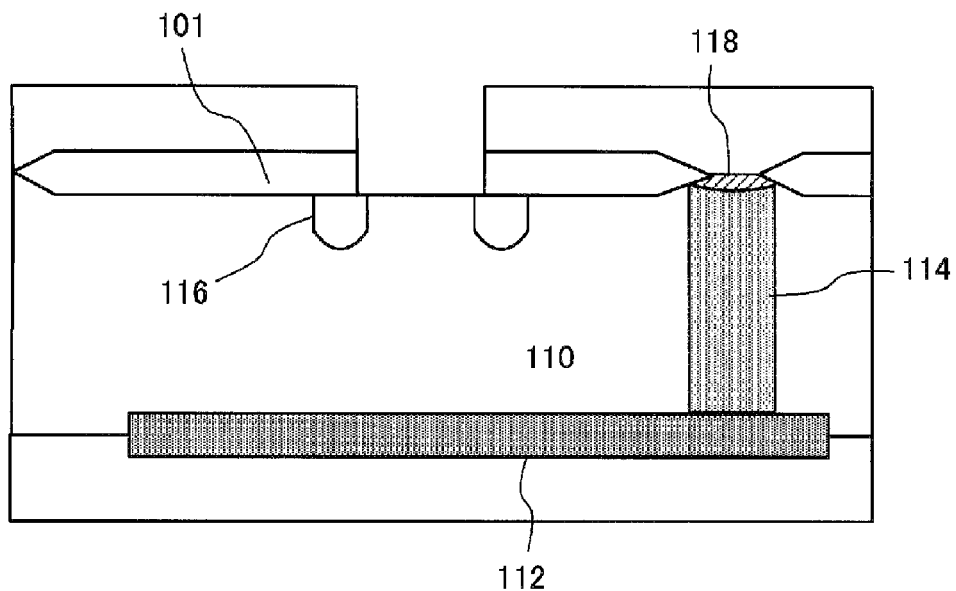
FIGS. 3(A) and 3(B) are schematic sectional views No. 2 showing the method of producing the Schottky diode according to the first embodiment of the present invention.
Figure 3B:
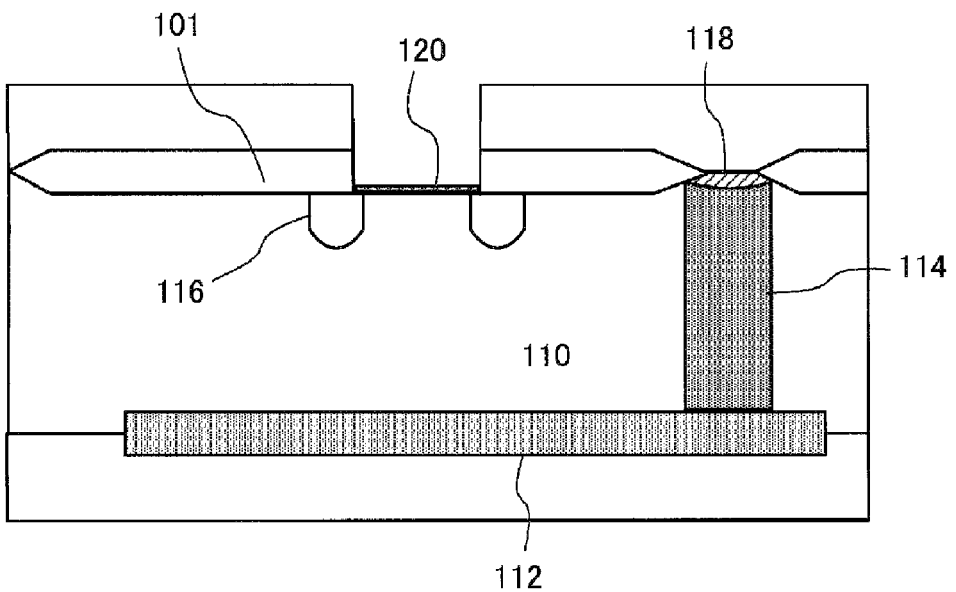
Figure 4A:
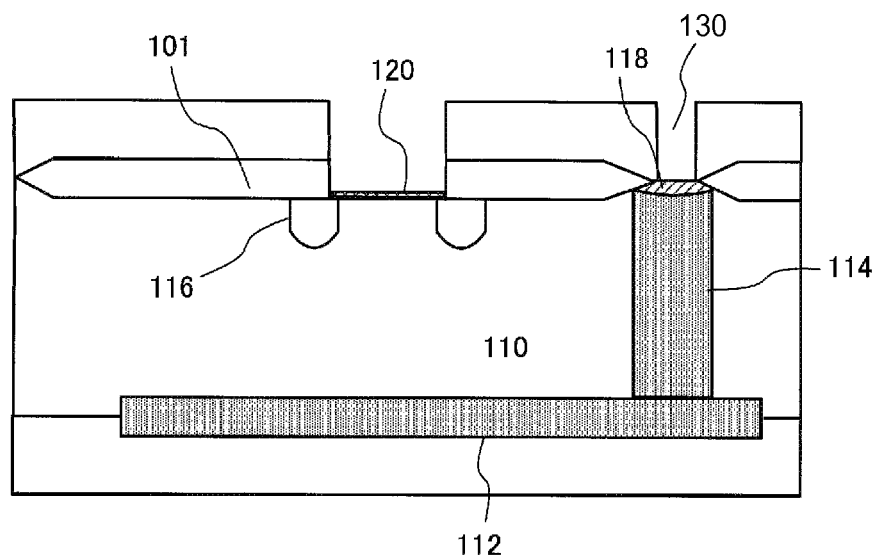
FIGS. 4(A) and 4(B) are schematic sectional views No. 3 showing the method of producing the Schottky diode according to the first embodiment of the present invention.
Figure 4B:
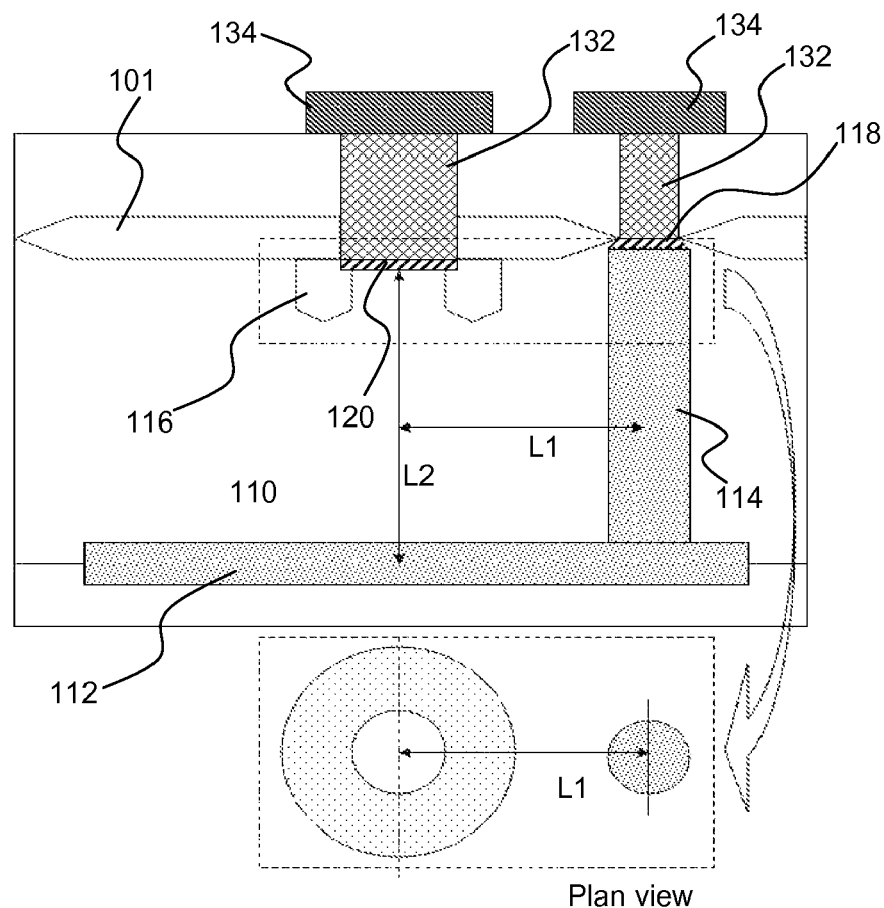

A first embodiment of the present invention will be explained. FIGS. 2(A) and 2(B) are schematic sectional views No. 1 showing a method of producing a Schottky diode according to the first embodiment of the present invention. FIGS. 3(A) and 3(B) are schematic sectional views No. 2 showing the method of producing the Schottky diode according to the first embodiment of the present invention. FIGS. 4(A) and 4(B) are schematic sectional views No. 3 showing the method of producing the Schottky diode according to the first embodiment of the present invention.

In the method of producing the Schottky diode, first, a semiconductor substrate is prepared using a semiconductor material. In the next step, as shown in FIG. 2(A), an N+ embedded oxide film 112 and an N-type epitaxial layer 110 are formed on the semiconductor substrate. In the next step, a field oxide film 101 is formed in the N-type epitaxial layer 110 as an insulation film for separating an upper surface of the N-type epitaxial layer 110. Further, an N− diffusion layer 114 is formed in the N-type epitaxial layer 110 as a cathode, and a P+ diffusion layer 118 is formed on an upper surface of the N− diffusion layer 114.

In the next step, as shown in FIG. 2(A), an upper surface of the N-type epitaxial layer 110 is etched to form an opening portion, where an anode is formed in the later step. The opening portion is formed at a position such that a distance between the anode and the N+ embedded oxide film 112 becomes greater than a distance between the anode and the N− diffusion layer 114.

In the next step, as shown in FIG. 2(B), a portion of the field oxide film 101 in the opening portion is etched, so that a hole having a size corresponding to the opening portion is formed in the field oxide film 101.

In the next step, as shown in FIG. 3(A), a P− diffusion layer 116 is formed in the N-type epitaxial layer 110 at positions adjacent to the hole in the field oxide film 101.

In the embodiment, the P− diffusion layer 116 is provided for alleviating an electrical field concentration at an end portion of the Schottky diode. When the P− diffusion layer 116 is formed, boron is implanted at an inclined angle of, for example, 45 degrees, through an ion implantation technology with the field oxide film 101 as a mask. In this step, the implantation angle is adjusted according to a relationship between an opening width and a height from the N-type epitaxial layer 110 to an upper portion of a resist. Accordingly, ions are implanted into only the end portion of the Schottky diode, not a center portion of the Schottky diode.

In the embodiment, the Schottky diode is configured such that a reverse voltage resistance thereof is determined by a distance between the anode and the N− diffusion layer 114 as the cathode, not by a distance between the anode and the N+ embedded oxide film 112.

In the next step, as shown in FIG. 3(B), a silicide layer 120 is formed with a sputtering process through performing a thermal process twice, so that the silicide layer 120 is formed of a Ti/TiN layer having a thickness of 700 Å/400 Å. More specifically, a Ti layer is formed on the upper surface of the N-type epitaxial layer 110, and then a TiN layer is formed on the Ti layer. In the next step, a first thermal process is applied, so that the Ti layer reacts with silicon in the N-type epitaxial layer 110, thereby forming the silicide layer 120. After the first thermal process, a second thermal process is applied, so that a non-reacted portion of Ti/TiN is etched and removed.

In this step, after the second thermal process is applied such that the non-reacted portion of Ti/TiN is etched and removed, as shown in FIG. 4(A), a hole 130 is formed at a forming area of a contact 132. Afterward, as shown in FIG. 4(B), the contact 132 is formed in the hole 130, and then, a wiring portion layer 134 is formed on the contact 132. It is noted that the contact 132 is also formed in the hole formed in the step shown in FIG. 2(A), and the wiring portion layer 134 is formed on the contact 132.

As shown in FIG. 4(B), in the Schottky diode produced through the steps described above, a center of the N− diffusion layer 114 in a plan view is away from a center of the silicide layer 120 in a plan view by a distance L1 (refer to a plane view at a lower portion of FIG. 4(B)). Further, a center of the N+embedded oxide film 112 in a vertical direction is away from the center of the silicide layer 120 in the plan view by a distance L2. In the embodiment, the Schottky diode is configured such that the distance L1 is greater than the distance L2.

As described above, in the embodiment, the field oxide film 101 as the insulation film is formed for separating the N-type epitaxial layer 110 (a base layer) and the wiring portion layers 134 (the first metal layer). Afterward, before the contacts 132 are formed through the photolithography and the etching process, it is possible to perform the photolithography and the etching process necessary for forming the Schottky diode; the ion plantation process for forming the P− diffusion layer 116; and the forming process of the silicide layer 120 (as a metal layer) in a self-align manner.

More specifically, in the embodiment, the hole or the opening portion is formed in the field oxide film 101, so that the ion implantation is performed through the opening portion. Then, the contacts 132 are formed using the opening portions. As a result, the location of the ion implantation is not shifted from where the contacts 132 are formed. Accordingly, it is not necessary to consider an alignment margin, thereby making it possible to reduce a size of the Schottky diode.

In the conventional Schottky diode described in the section of "BACKGROUND OF THE INVENTION AND RELATED ART STATEMENT", the reverse voltage resistance is determined by the distance (in a vertical direction) between the P− diffusion layer 16 and the N+ embedded diffusion layer 12. Accordingly, it is difficult to obtain a desirable reverse voltage resistance.

On the other hand, in the embodiment of the present invention described above, the reverse voltage resistance is determined by the distance (in a lateral direction) between the anode or the P− diffusion layer 116 and the N− diffusion layer 114. Accordingly, it is possible to arbitrarily obtain the desirable reverse voltage resistance. In other words, it is possible to arbitrarily adjust the reverse voltage resistance without changing a thickness of the N− type epitaxial layer 110. Further, it is possible to reduce a length of a current path and a parasitic resistivity, thereby improving a current capability in a forward direction.

Second Embodiment

Figure 5:
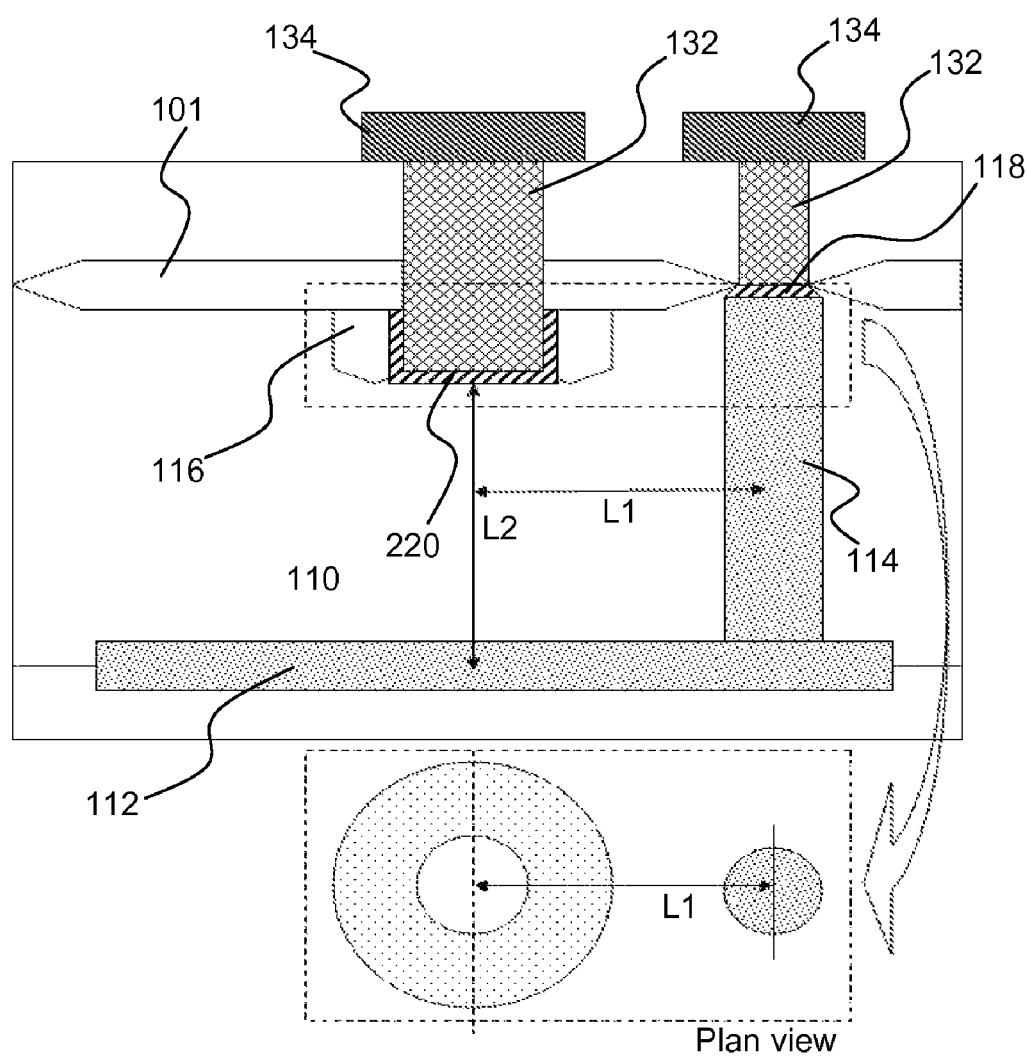
FIG. 5 is a schematic sectional view showing a configuration of a Schottky diode according to a second embodiment of the present invention.

A second embodiment of the present invention will be explained next. FIG. 5 is a schematic sectional view showing a configuration of a Schottky diode according to a second embodiment of the present invention. In the following description, components in the second embodiment similar to those in the first embodiment are designated with the same reference numerals, and explanations thereof are omitted.

As shown in FIG. 5, in the embodiment, in the photolithography and the etching process necessary for forming the Schottky diode, the N-type epitaxial layer 110 is etched through a trench technology to form a silicide layer 220. When the silicide layer 220 has a trench structure, the silicide layer 220 has a larger area. Other configurations are similar to those in the first embodiment.

As described above, in the second embodiment, the silicide layer 220 has the trench structure. Accordingly, it is possible to expand a current path and reduce a parasitic resistivity, thereby further improving a current capability in a forward direction.

Further, as shown in FIG. 5, in the Schottky diode produced through the steps described above, a center of the N− diffusion layer 114 in a plan view is away from a center of the silicide layer 220 in a plan view by a distance L1 (refer to a plane view at a lower portion of FIG. 5). Further, a center of the N+ embedded oxide film 112 in a vertical direction is away from the center of the silicide layer 120 in the plan view by a distance L2. In the second embodiment, similar to the first embodiment, the Schottky diode is configured such that the distance L1 is greater than the distance L2.

In the second embodiment, similar to the first embodiment, the reverse voltage resistance is determined by the distance (in a lateral direction) between the anode and the N− diffusion layer 114. Accordingly, it is possible to arbitrarily obtain the desirable reverse voltage resistance. In other words, it is possible to arbitrarily adjust the reverse voltage resistance without changing a thickness of the N-type epitaxial layer 110. Further, it is possible to reduce a length of a current path and a parasitic resistivity, thereby improving a current capability in a forward direction.

The disclosure of Japanese Patent Application No. 2009-191545, filed on Aug. 21, 2009, is incorporated in the application by reference.

While the invention has been explained with reference to the specific embodiments of the invention, the explanation is illustrative and the invention is limited only by the appended claims.

What is claimed is:

1. A method of producing a Schottky diode comprising the steps of:
preparing a semiconductor substrate;
forming a first conductive type embedded oxide film and a first conductive type epitaxial layer on the semiconductor substrate;
forming a first conductive type diffusion layer in the first conductive type epitaxial layer so that the first conductive type diffusion layer is connected to the first conductive type embedded oxide film;
forming an insulation film on the first conductive type epitaxial layer;
forming a second conductive type diffusion layer through ion implantation with the insulation film as a mask so that an electrical field concentration at an end portion of the Schottky diode is alleviated;
forming a silicide layer (a metal layer) at an upper portion of the second conductive type diffusion layer;
forming a contact in the insulation film so that the contact is connected to the first conductive type diffusion layer; and
forming a wiring portion layer on the insulation film so that the wiring portion layer is connected to the contact,
wherein said silicide layer is away from the first conductive type embedded oxide film by a first distance in a depth direction greater than a second distance between the silicide layer and the first conductive type diffusion layer in a horizontal direction,
said first distance corresponds to a length between a center of the silicide layer in a plan view and a center of the first conductive type embedded oxide film in the plan view, and
said second distance corresponds to a length between the center of the silicide layer and the first conductive type embedded oxide film.

2. The method of producing the Schottky diode according to claim 1, wherein, in the step of forming the second conductive type diffusion layer, ions are implanted only at the end portion of the Schottky diode not at a center portion of the Schottky diode.

3. The method of producing the Schottky diode according to claim 1, further comprising the step of etching the first conductive type epitaxial layer to form a trench before the step of forming the silicide layer so that the silicide layer is formed in the trench.

4. The method of producing the Schottky diode according to claim 3, wherein, in the step of forming the contact in the insulation film, said contact is formed in the trench.

* * * * *